US009311848B2

(12) United States Patent
Keum

(10) Patent No.: US 9,311,848 B2
(45) Date of Patent: Apr. 12, 2016

(54) ORGANIC LIGHT EMITTING DISPLAY AND DRIVING METHOD THEREOF

(71) Applicant: Samsung Display Co., Ltd., Yongin, Gyeonggi-Do (KR)

(72) Inventor: Min-Ha Keum, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 394 days.

(21) Appl. No.: 14/018,843

(22) Filed: Sep. 5, 2013

(65) Prior Publication Data

US 2014/0232409 A1 Aug. 21, 2014

(30) Foreign Application Priority Data

Feb. 21, 2013 (KR) ........................ 10-2013-0018616

(51) Int. Cl.

*G01R 31/00* (2006.01)
*G09G 3/30* (2006.01)
*G09G 3/32* (2006.01)
*G09G 3/00* (2006.01)

(52) U.S. Cl.

CPC .............. *G09G 3/3225* (2013.01); *G09G 3/006* (2013.01); *G09G 3/3208* (2013.01); *G09G 3/3233* (2013.01); *G09G 2320/043* (2013.01); *G09G 2320/045* (2013.01); *G09G 2320/048* (2013.01)

(58) Field of Classification Search

CPC ........... G09G 3/006; G09G 3/30; G09G 3/32; G09G 3/3208; G09G 3/3216; G09G 3/3225; G09G 3/3233; G09G 3/14; G09G 2320/043; G09G 2320/045; G09G 2320/048; G01R 31/44

USPC ........ 324/403, 414, 555, 718; 345/39, 46, 77, 345/82, 84, 183

See application file for complete search history.

(56) References Cited

U.S. PATENT DOCUMENTS

| | | | | |
|---|---|---|---|---|
| 8,643,574 | B2 * | 2/2014 | Miyamoto | G09G 3/3233 250/200 |
| 9,047,802 | B2 * | 6/2015 | Kwon | G09G 3/006 |
| 2007/0046581 | A1 * | 3/2007 | Kwak | G09G 3/006 345/68 |
| 2011/0032283 | A1 | 2/2011 | Baek | |
| 2012/0113076 | A1 * | 5/2012 | Momose | G09G 3/3614 345/209 |
| 2012/0256971 | A1 | 10/2012 | Shin et al. | |
| 2013/0141314 | A1 * | 6/2013 | Ka | G09G 3/006 345/55 |
| 2014/0139255 | A1 * | 5/2014 | Chen | G09G 3/006 324/760.01 |

FOREIGN PATENT DOCUMENTS

| | | |
|---|---|---|
| KR | 10-2011-0013925 | 2/2011 |
| KR | 10-2011-0064089 | 6/2011 |
| KR | 10-2012-0114988 | 10/2012 |

* cited by examiner

*Primary Examiner* — Hoai-An D Nguyen
(74) *Attorney, Agent, or Firm* — Robert E. Bushnell, Esq.

(57) ABSTRACT

An organic light emitting display and a driving method thereof, which can effectively detect degradation information of pixels in a display. An organic light emitting display includes a pixel unit and a degradation detector. The pixel unit has a plurality of pixels positioned at intersection portions of scan lines and data lines. The degradation detector divides the pixel unit into a plurality of first blocks each including a plurality of pixels, and detects degradation information for each second block including a plurality of first blocks. In the degradation detector, the second blocks are divided so that each second block shares one or more first blocks with another second block adjacent thereto.

20 Claims, 6 Drawing Sheets

ORGANIC LIGHT EMITTING DISPLAY AND DRIVING METHOD THEREOF

CLAIM PRIORITY

This application makes reference to, incorporates the same herein, and claims all benefits accruing under 35 U.S.C. §119 from an application earlier filed in the Korean Intellectual Property Office on 21 Feb. 2013 and there duly assigned Serial No. 10-2013-0018616.

BACKGROUND OF THE INVENTION

1. Field of the Invention

An aspect of the present invention relates to an organic light emitting display and a driving method thereof.

2. Description of the Related Art

Recently, there have been developed various types of flat panel displays capable of reducing the weight and volume of cathode ray tubes, which are disadvantages. The flat panel displays include a liquid crystal display, a field emission display, a plasma display panel, an organic light emitting display, and the like.

The above information disclosed in this Related Art section is only for enhancement of understanding of the background of the invention and therefore it may contain information that does not form the prior art that is already known to a person of ordinary skill in the art.

SUMMARY OF THE INVENTION

Embodiments provide an organic light emitting display and a driving method thereof, which can effectively detect degradation information of pixels.

According to an aspect of the present invention, there is provided an organic light emitting display, including: a pixel unit having a plurality of pixels positioned at intersection portions of scan lines and data lines; and a degradation detector dividing the pixel unit into a plurality of first blocks each including a plurality of pixels, and detecting degradation information for a second block that includes a plurality of first blocks, said degradation detector divides the second blocks so that each second block shares one or more first blocks with another second block adjacent thereto.

The degradation detector may generate accumulation data for each first block of the plurality of first blocks during a certain period, and may detect the degradation information by adding the accumulation data for each second block.

The degradation detector may divide the pixel unit into the second blocks to each include two or more first blocks in a horizontal direction and two or more first blocks in a vertical direction.

The degradation detector may divide the pixel unit into the second blocks by shifting the second blocks in the horizontal and vertical directions, corresponding to shift interval information included in a shift control signal supplied from the outside thereof.

The degradation detector may divide the pixel unit into the second blocks by shifting the second blocks in the horizontal and vertical directions, corresponding to predetermined shift interval information.

The degradation detector may include a data accumulation unit generating accumulation data for each first block during a certain period; a degradation data generation unit generating degradation data by adding the accumulation data for each second block; and a degradation decision unit generating a degradation detection signal corresponding to the degradation data.

The data accumulation unit may include a first counter receiving a first horizontal block control signal that means the number of data in the horizontal direction so as to generate a first counting signal by counting the number of data in the horizontal direction; a second counter receiving a first vertical block control signal that means the number of data in the vertical direction so as to generate a second counting signal by counting the number of data in the vertical direction; a third counter generating a third counting signal sequentially increased corresponding to the first counting signal; a fourth counter generating a fourth counting signal sequentially increased corresponding to the second counting signal; and an accumulation data generator generating accumulation data for each first block divided by the third and fourth counting signals during a certain period.

The degradation data generation unit may include a detection position setting unit allowing the second blocks to be divided, using a second horizontal block control signal including information on the positions of first blocks on a horizontal line, a second vertical block control signal including information on the positions of first blocks on a vertical line, and information on the interval by which the second blocks are shifted; and a data adding unit generating a data addition value of each second block by adding accumulation data of the first blocks included in each second block, and generating degradation data for each second block, based on the data addition value.

The degradation data may include information on the position and degradation of the second block.

The degradation decision unit may generate the degradation detection signal when the degradation data is a predetermined reference value or more.

The degradation detection signal may include information on the position and degradation of a corresponding second block.

According to an aspect of the present invention, there is provided a driving method of an organic light emitting display, including: dividing a pixel unit into a plurality of first blocks each including a plurality of pixels; generating accumulation data by accumulating data for each first block during a certain period; dividing the pixel unit into second blocks each including a plurality of first blocks; and detecting degradation information for each second block by adding accumulation data of the first blocks included in each second block, wherein the second blocks are divided by being sequentially shifted in horizontal and vertical directions, and wherein the second blocks are divided so that each second block shares one or more first blocks with another second block adjacent thereto.

The second blocks may be divided so that each second block includes two or more first blocks in the horizontal direction and two or more first blocks in the vertical direction.

The second blocks may be divided by being shifted in the horizontal and vertical directions, corresponding to shift interval information included in a shift control signal supplied from the outside of the organic light emitting display.

The second blocks may be divided by being shifted in the horizontal and vertical directions, corresponding to predetermined shift interval information.

The dividing of the pixel unit into the plurality of first blocks each including the plurality of pixels may include receiving a first horizontal block control signal that means the number of data in the horizontal direction so as to generate a first counting signal by counting the number of data in the horizontal direction; receiving a first vertical block control signal that means the number of data in the vertical direction so as to generate a second counting signal by counting the number of data in the vertical direction; generating a third counting signal sequentially increased corresponding to the first counting signal; generating a fourth counting signal sequentially increased corresponding to the second counting signal; and allowing the first blocks to be divided by the third and fourth counting signals.

The dividing of the pixel unit into the second blocks each including the plurality of first blocks may include allowing the second blocks to be divided, using a second horizontal block control signal including information on the positions of first blocks on a horizontal line, a second vertical block control signal including information on the positions of first blocks on a vertical line, and information on the interval by which the second blocks are shifted The driving method may further include deciding the presence of degradation by comparing the degradation information for each second block with a predetermined reference value. The driving method may further include generating a degradation detection signal including information on the position and degradation of a corresponding second block when the degradation information is the predetermined reference value or more.

According to an aspect of the present invention, there is provided an organic light emitting display, including: a pixel unit having a plurality of pixels positioned at intersection portions of scan lines and data lines; and a degradation detector dividing the pixel unit into a plurality of first blocks each including a plurality of pixels, and detecting degradation information for a second block that includes a plurality of first blocks, said degradation detector divides the second blocks so that each second block shares one or more first blocks with another second block adjacent thereto, wherein the second blocks are divided by being sequentially shifted in horizontal and vertical directions, and wherein the second blocks are divided so that each second block shares one or more first blocks with another second block immediately adjacent thereto.

As described above, according to the present invention, the pixel unit is divided into first blocks each including a plurality of pixels, and accumulation data is generated for each first block. In addition, degradation information of the pixels is detected by adding accumulation data for each second block including a plurality of first blocks. In this case, the second blocks partially overlap with each other so that each second block shares one or more first blocks with another second block adjacent thereto. Accordingly, the degradation information can be more effectively detected.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
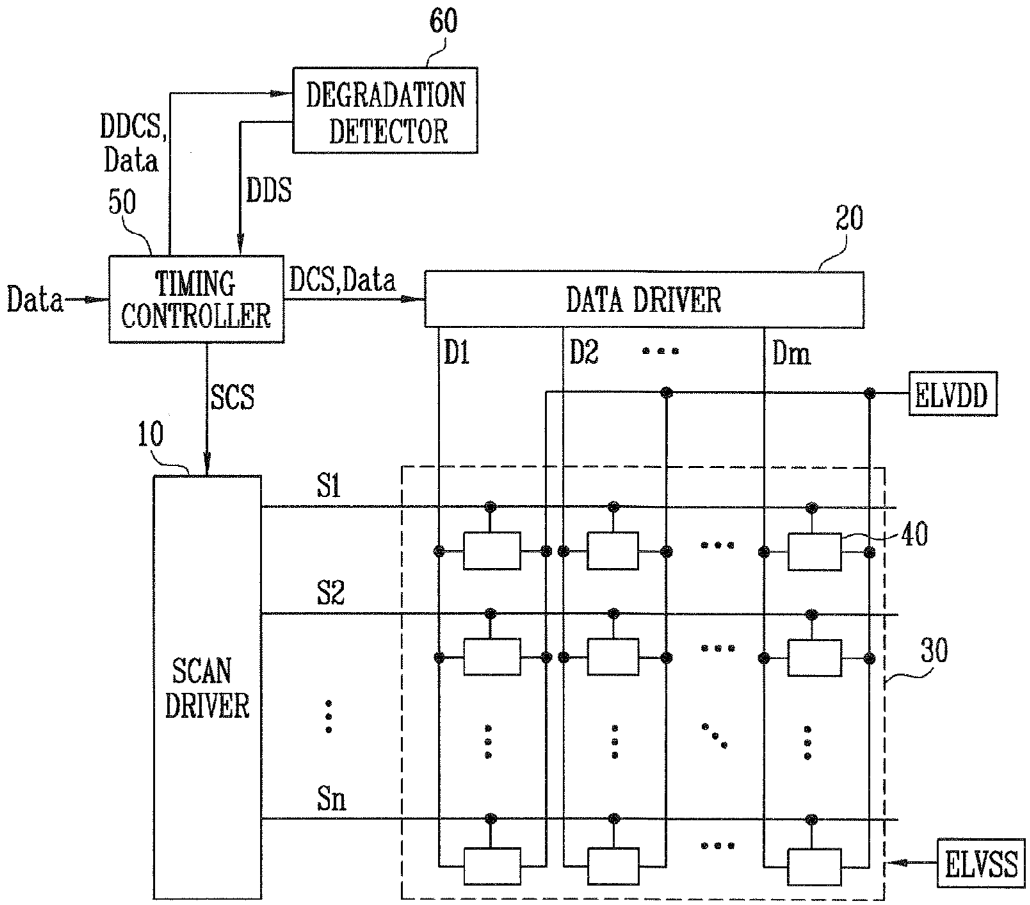
FIG. 1 is a block diagram illustrating an organic light emitting display according to an embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Organic light emitting display displays images using organic light emitting diodes (OLEDs) emit light through recombination of electrons and holes. The organic light emitting display has a fast response speed and is driven with low power consumption.

The organic light emitting display includes a pixel unit having a plurality of pixels arranged in a matrix form at intersection portions of scan lines and data lines. Each pixel has an OLED that emits light with luminance corresponding to a data signal, and accordingly, an image is displayed in the pixel unit.

However, the OLED is degraded, corresponding to emission time and luminance (current amount), as time elapses. Accordingly, there is a problem in that the quality of an image is lowered, such as occurrence of image sticking. Therefore, the degradation of the OLED should be appropriately compensated. To this end, it is necessary to seek a plan for effectively detecting degradation information of pixels.

Figure 2A:
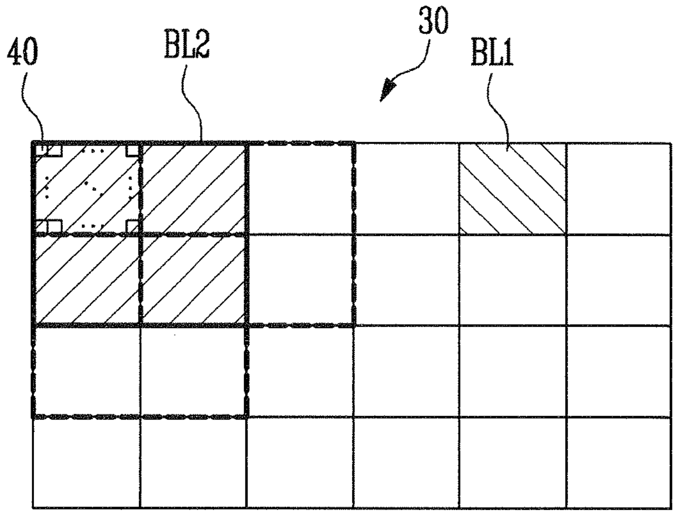
FIGS. 2A and 2B are views illustrating embodiments of a pixel unit divided into first blocks and second blocks according to the present invention.
Figure 2B:
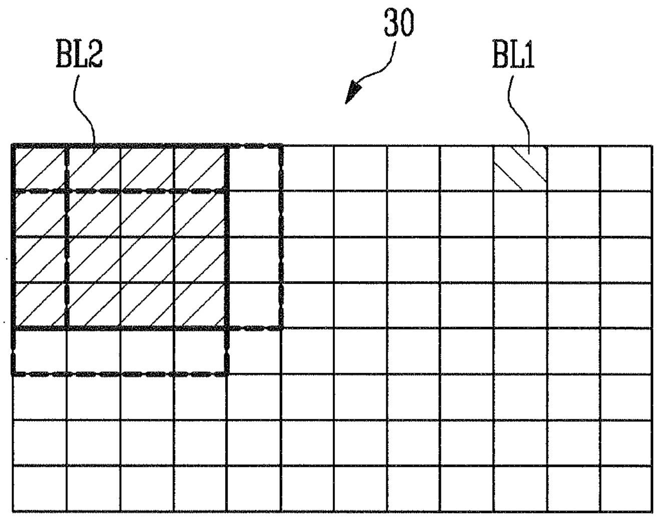

FIG. 1 is a block diagram illustrating an organic light emitting display according to an embodiment of the present invention. FIGS. 2A and 2B are views illustrating embodiments of a pixel unit divided into first blocks and second blocks according to the present invention.

First, referring to FIG. 1, the organic light emitting display according to this embodiment includes a pixel unit 30 having a plurality of pixels 40 positioned at intersection portions of scan lines S1 to Sn and data lines D1 to Dm, a scan driver 10 supplying a scan signal to the scan lines S1 to Sn, a data driver 20 supplying a data signal to the data lines D1 to Dm, a timing controller 50 controlling the scan driver 10, the data driver 20 and a degradation detector 60, and the degradation detector 60 detecting degradation information of the pixels 40.

The pixels 40 receives a first power source ELVDD and a second power source ELVSS, supplied from the outside of the pixel unit 30. The second power source ELVSS may be a power source different from the first power source ELVDD. For example, the second power source ELVSS may be set to have a lower voltage than that of the first power source ELVDD. Each pixel 40 controls the amount of current flowing from the first power source ELVDD to the second power source ELVSS via an organic light emitting diode (OLED), corresponding to a data signal provided when a scan signal is supplied, thereby emitting light with luminance corresponding to the data signal.

The scan driver 10 generates a scan signal, corresponding to a scan driving control signal SCS supplied from the timing controller 50, and supplies the generated scan signal to the scan signals S1 to Sn. If the scan signal is supplied to the scan lines S1 to Sn, pixels 40 are selected for each horizontal line.

The data driver 20 generates a data signal, corresponding to a data driving control signal DCS and data Data, which are supplied from the timing controller 50, and supplies the generated data signal to the data lines D1 to Dm.

The timing controller 50 generates a scan driving control signal SCS, a data driving control signal DCS and a degradation detection control signal DDCS, corresponding to synchronization signals (not shown) supplied from the outside thereof, and supplies the generated signals to the scan driver 10, the data driver 20 and the degradation detector 60. The timing controller 50 provides the data driver 20 and the degradation detector 60 with data Data supplied from the outside thereof. In a case where degradation is compensated by data conversion, the data Data provided from the timing controller 50 to the data driver 20 may be provided in the form of data changed by reflecting the compensated degradation.

The degradation detector 60 detects degradation information of the pixels, corresponding to the degradation detection control signal DDCS supplied from the timing controller 50, and outputs a degradation detection signal DDS corresponding to the detected degradation information. The degradation detection signal DDS output from the degradation detector 60 may be supplied to, for example, the timing controller 50 so as to be used in changing the data Data so that the degradation of the pixels is compensated. However, the present invention is not limited thereto. For example, the degradation detection signal DDS may be used in changing the gamma voltage of the data driver 20 or may be used in adjusting the emission time of the pixels 40.

The degradation detector 60 divides the pixel unit 30 into a plurality of first blocks each including a plurality of pixels, and again divides the pixel unit 30 into second blocks each including a plurality of first blocks, thereby detecting degradation information of the pixels 40 fore each second block. For example, the degradation detector 60, as shown in FIG. 2A, may divide the pixel unit 30 into a plurality of first blocks BL1 and also divide the pixel unit 30 into second blocks BL2 each including a total of four first blocks BL1, i.e., two first blocks in the horizontal direction and two first blocks in the vertical direction.

Here, the degradation degree of the pixels 40 may be determined, corresponding to emission time and luminance. Thus, the degradation detector 60 estimates the degradation degree of the pixels 40 by accumulating data Data supplied to the pixels 40.

If accumulation data are generated and stored with respect to each pixel 40, and degradation information is detected based on the accumulation data, a large-capacity memory is required. As a result, cost may be increased, and efficiency may be lowered.

Thus, the degradation detector 60 generates accumulation data for each first block BL1 including the plurality of pixels 40 during a certain period, and detects and stores degradation information by adding accumulation data for each second block BL2 greater than the first block BL1 in the detection of degradation. For example, the degradation detector 60 may be configured to include two or more first blocks BL1 in the horizontal direction and two or more first blocks BL1 in the vertical direction, thereby improving degradation detection efficiency.

Meanwhile, if a corresponding degradation detection period is finished, the accumulation data for each first block BL1 may be reset and then reproduced by accumulating data for a period corresponding to the next degradation detection period. The value obtained by adding accumulation data for each second block BL2 may reflect an amount used in the organic light emitting display while being continuously accumulated.

In this case, the degradation detector 60 allows each second block BL2 to overlap with a second block adjacent thereto. For example, the degradation detector 60 may divide the pixel unit 30 into different second blocks BL2 by sequentially shifting the second blocks BL2 by one first block BL1 in the horizontal direction, and may also divide the pixel unit 30 into different second blocks BL2 by sequentially shifting the second blocks BL2 by one first block BL1 in the vertical direction.

For example, in the embodiment shown in FIG. 2A, second blocks BL2 are divided by shifting the second blocks BL2 by the half of the lateral length of the second block BL2 in the horizontal direction, and other second blocks BL2 are divided by shifting the second blocks BL2 by the half of the longitudinal length of the second block BL2.

If the degradation information is detected and stored for each second block BL2 greater than the first block BL1 as described above, the capacity of a memory can be decreased, thereby improving efficiency while reducing cost.

If the second blocks BL2 are arranged to overlap with each other by shifting the second blocks BL2 by the first block BL1 in the horizontal and vertical directions, it is possible to prevent a problem in that when the second blocks BL2 do not overlap with each other, an image sticking phenomenon occurring at the boundary region between the second blocks BL2 is not detected, thereby improving the accuracy of degradation detection.

For example, in a case where the second blocks BL2 do not overlap with each other, the occurrence of degradation may be concentrated on the boundary portion between two adjacent second blocks BL2. Although the occurrence of degradation is concentrated on the boundary portion between the two adjacent second blocks BL2, it may be recognized as if the degradation has occurred in each of the two adjacent second blocks BL2, and therefore, the position and degree of the degradation may not be exactly detected. However, in the present invention, the second blocks BL2 are divided to overlap with each other, so that the existing region in which the detection of degradation was impossible is positioned within the second block including the overlapping region of the second blocks BL2. Accordingly, the degradation can be detected, thereby more exactly detecting degradation information.

That is, if the image sticking phenomenon caused by degradation occurs at the boundary between the second blocks BL2 when the second blocks BL2 are divided not to overlap with each other, the degradation may be not properly recognized, and therefore, compensation for the degradation may not be appropriately performed. However, in the present invention, if the second blocks BL2 are shifted to overlap with each other, the degradation in the existing region in which the detection of degradation was impossible is also detected, so that the compensation for the degradation can be appropriately performed.

In the present invention, the sizes of the first and second blocks BL1 and BL2 and the interval by which the second blocks BL2 are shifted may be variously modified and embodied according to design conditions.

For example, as shown in FIG. 2B, the first blocks BL1 may be divided to be smaller than those of FIG. 2A, and the second blocks BL2 may be configured to each include a total of 16 first blocks BL1, i.e., four first blocks BL1 in the horizontal direction and four first blocks BL1 in the vertical direction. In addition, the second blocks BL2 may be sequentially divided while being shifted by one first block along each direction. That is, the second blocks BL2 may be sequentially divided by being shifted by ¼ of the lateral length of the second block BL2 along the horizontal direction and being shifted by ¼ of the longitudinal length of the second block BL2 along the vertical direction.

In this case, as the number of the first and second blocks BL1 and BL2 increase, the number of data to be stored also increases, and therefore, it is necessary to increase the capacity of the memory. However, the accuracy of degradation detection can be further improved. Thus, the sizes of the first and second blocks BL1 and BL2 and the dividing method of the first and second blocks BL1 and BL2 can be variously modified and embodied according to a desired design condition or priority order.

When the second blocks BL2 are divided, information on the interval by which the second blocks BL2 are shifted along the horizontal and vertical directions may be fixed as a predetermined value. Alternatively, the second blocks BL2 may be divided by receiving a shift control signal including the information on the interval from the outside. Thus, the degree to which the second blocks BL2 are shifted and divided can be adjusted, thereby freely changing the division of the second blocks BL2.

As described above, in the present invention, the degradation detector 60 divides the pixel unit 30 into first blocks BL1 each including a plurality of pixels 40, and generates accumulation data for each first block BL1. In addition, the degradation detector 60 detects degradation information by adding accumulation data for each second block BL2 including a plurality of first blocks BL1. Further, the second blocks BL2 partially overlap with each other so that each second block BL2 shares one or more first blocks BL1 with another second block adjacent thereto. Accordingly, the degradation information can be more effectively detected.

The configuration and operation of the degradation detector 60 will be described in detail with reference to FIGS. 3 to 6D.

Figure 3:
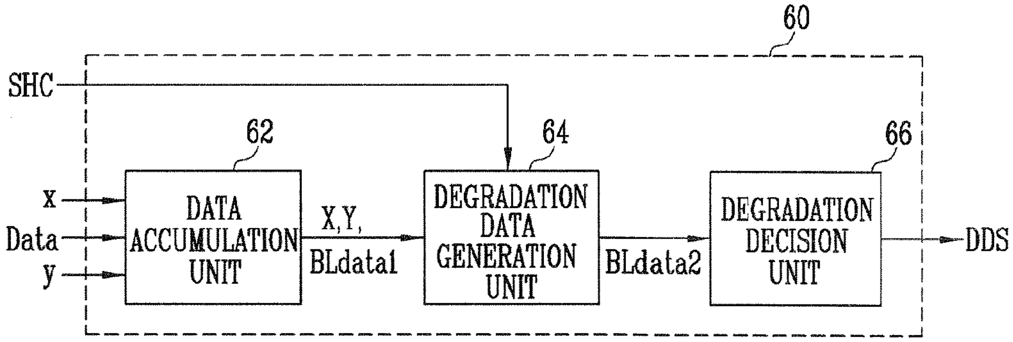
FIG. 3 is a block diagram illustrating an example of a degradation detector shown in FIG. 1.
Figure 4:
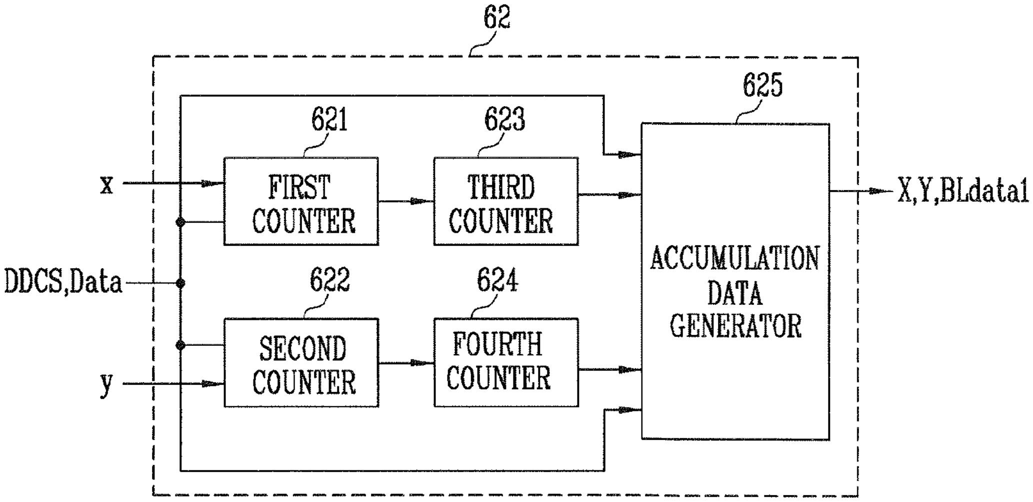
FIG. 4 is a block diagram illustrating an example of a data accumulation unit shown in FIG. 3.
Figure 5:
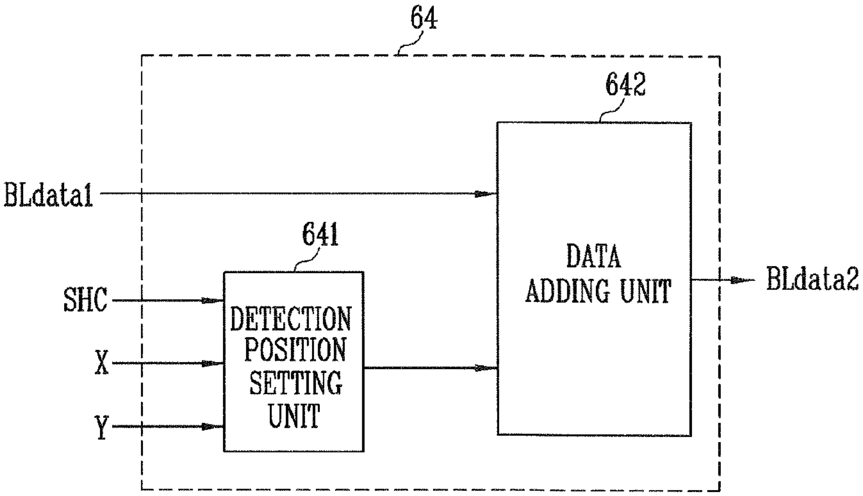
FIG. 5 is a block diagram illustrating an example of a degradation data generation unit shown in FIG. 3.

FIG. 3 is a block diagram illustrating an example of the degradation detector shown in FIG. 1. FIG. 4 is a block diagram illustrating an example of a data accumulation unit shown in FIG. 3. FIG. 5 is a block diagram illustrating an example of a degradation data generation unit shown in FIG. 3. FIGS. 6A to 6D are views illustrating a method of detecting degradation information of the organic light emitting display according to the embodiment of the present invention.

First, referring to FIG. 3, the degradation detector 60 according to this embodiment includes a data accumulation unit 62 generating accumulation data BLdata1 for each first block during a certain period, a degradation data generation unit 64 generating degradation data BLdata2 by adding the accumulation data BLdata1 for each second block, and a degradation decision unit 66 deciding the presence of degradation corresponding to the degradation data BLdata2, and generating a degradation detection signal DDS containing the position information and degradation degree of a corresponding second block. Accordingly, the degradation detector 60 according to this embodiment detects degradation information by generating accumulation data for each first block during a certain period and adding the accumulation data for each second block.

More specifically, the data accumulation unit 62, as shown in FIG. 4, includes a first counter 621 generating a first counting signal by counting the number of data in the horizontal direction, a second counter 622 generating a second counting signal by counting the number of data in the vertical direction, a third counter 623 generating a third counting signal sequentially increased corresponding to the first counting signal, a fourth counter 624 generating a fourth counting signal sequentially increased corresponding to the second counting signal, and an accumulation data generator 625 dividing the pixel unit into first blocks, corresponding to the third and fourth counting signals, and generating accumulation data for each first block during a certain period corresponding to the degradation detection period.

Figure 6A:
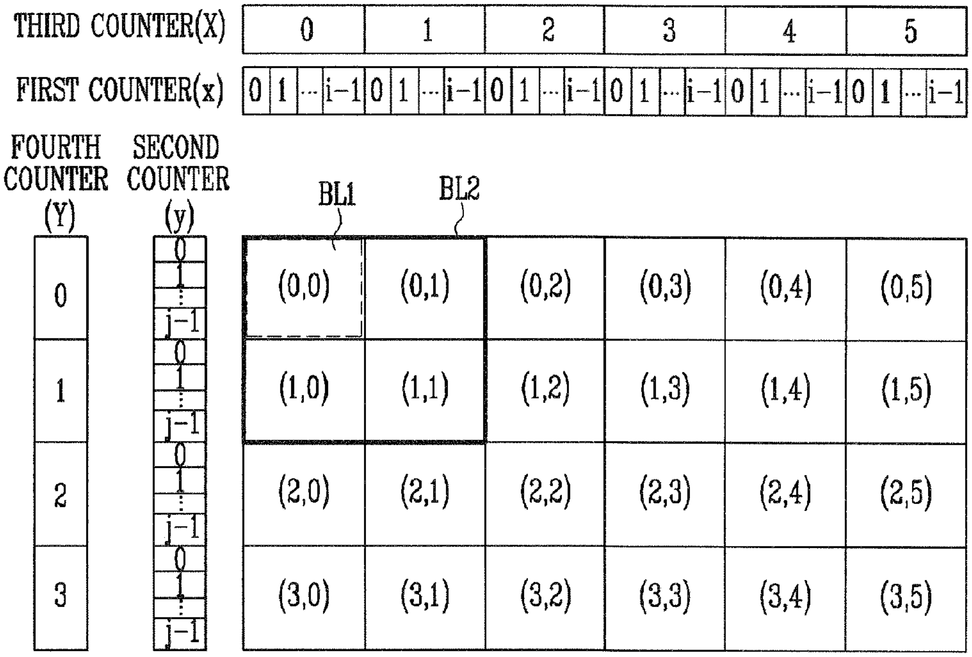
FIGS. 6A to 6D are views illustrating a method of detecting degradation information of the organic light emitting display according to the embodiment of the present invention.

The first counter 621 receives a first horizontal block control signal x that means the number of data in the horizontal direction and data Data. Here, the first horizontal block control signal x may be included in the degradation detection control signal DDCS to be supplied to the first counter 621. The first counter 621 receiving the first horizontal block control signal x, as shown in FIG. 6A, generates a first counting signal by counting the number of data in the horizontal direction, corresponding to the first horizontal block control signal x. In a case where the first block BL1 may be set to include i pixels in the horizontal direction, the first counter 621 generates the first counting signal whenever i data Data are input in the horizontal direction.

The second counter 622 receives a first vertical block control signal y that means the number of data in the vertical direction and data Data. Here, the first vertical block control signal y may be included in the degradation detection control signal DDCS to be supplied to the second counter 622. The second counter 622 receiving the first vertical block control signal y, as shown in FIG. 6A, generates a second counting signal by counting the number of data in the vertical direction, corresponding to the first vertical block control signal y. In a case where the first block BL1 may be set to include j pixels in the vertical direction, the second counter 622 generates the second counting signal whenever j data Data are input in the vertical direction.

The third counter 623 receives a first counting signal, and generates a third counting signal when the first counting signal may be input. Here, the third counting signal may be sequentially increased, corresponding to the first counting signal. For example, the third counting signal may be increased in the order of 0, 1, 2, . . . , and each third counting signal means a first block divided for each horizontal direction.

The fourth counter 624 receives a second counting signal, and generates a fourth counting signal when the second counting signal may be input. Here, the fourth counting signal may be sequentially increased, corresponding to the second counting signal. For example, the fourth counting signal may be increased in the order of 0, 1, 2, . . . , and each fourth counting signal means a first block divided for each vertical direction.

The accumulation data generator 625 receives a third counting signal, a fourth counting signal and data Data. The accumulation data generator 625 generates accumulation data BLdata1 by accumulating data for each first block BL1 divided by the third and fourth counting signals during a certain period, and outputs, to the degradation data generation unit 64, the generated accumulation data BLdata1 together with a second horizontal block control signal X and a second vertical block control signal Y, which include information on the positions of corresponding first blocks.

As shown in FIG. 5, the degradation data generation unit 64, for example, includes a detection position setting unit 641 and a data adding unit 642. The detection position setting unit 641 allows second blocks BL2 to be divided, using a second horizontal block control signal X and a second vertical block control signal Y, which include information on the positions of first blocks BL1, and a shift control signal SHC including information on the interval by which the second vertical block control signal Y and the second blocks BL2 are shifted. The data adding unit 642 generates degradation data BLdata2 by adding the accumulation data BLdata1 for each second block BL2.

More specifically, the detection position setting unit 641 receives a second horizontal block control signal X including information on the positions of first blocks BL1 on a horizontal line, and a second vertical block control signal Y including information on the positions of the first blocks BL1 on a vertical line. In addition, the detection position setting unit 641 receives a shift control signal SHC including information on the interval by which the second blocks BL2 are shifted in the horizontal and vertical directions. Here, the shift control signal SHC may be included in the degradation detection control signal DDCS. The detection position setting unit 641 allows second blocks BL2 to be divided, using the second horizontal block control signal X, the second vertical block control signal Y and the shift control signal SHC.

The data adding unit 642 generates a data addition value of each second block BL2 by adding accumulation data of a plurality of first blocks BL1 included in each second block BL2, and generates degradation data BLdata2 for each second block BL2, based on the data addition value. Here, the degradation data BLdata2 includes degradation information of the corresponding second block BL2 and information on the position of the corresponding second block BL2. The degradation data BLdata2 generated in the data adding unit 642 may be supplied to the degradation decision unit 66.

The degradation decision unit 66 decides the presence of degradation and the degree of the degradation by comparing the degradation data BLdata2 with a predetermined reference value. For example, if the degradation data BLdata2 is the reference value or more, the degradation decision unit 66 estimates that the lowering of image quality will occur due to the degradation of pixels in a corresponding second block BL2, and outputs a degradation detection signal DDS. In this case, the degradation decision unit 66 allows information on the position and degradation of the corresponding second block BL2 to be included in the degradation detection signal DDS, so that the degradation of a corresponding region can be appropriately compensated in the timing controller or the like.

The process in which degradation information may be detected by the degradation detector 60 according to this embodiment will be described in detail. First, as shown in FIG. 6A, first blocks BL1 are divided by the first and second counters, and information on the positions of the first blocks BL1 are detected by the third and fourth counters.

If the first blocks BL1 are divided, data input for each first block BL1 are accumulated at every predetermined degradation detection period, thereby generating and storing accumulation data.

If the generation of the accumulation data for the predetermined period is completed, the detection of degradation information may be started, corresponding to the degradation detection control signal. The detection of degradation information may be performed by adding accumulation data of first blocks BL1 included each second block BL2.

If the addition of the accumulation data may be completed, degradation data corresponding to the accumulation data may be generated. Then, the presence of degradation and the degree of the degradation are decided, based on the degradation data, and a degradation detection signal including information on the position and degradation of the second block BL2 in which the degradation occurs based on the decided result may be generated. The degradation detection signal may be supplied to the timing controller or the like to appropriately compensate for the degradation.

Figure 6B:
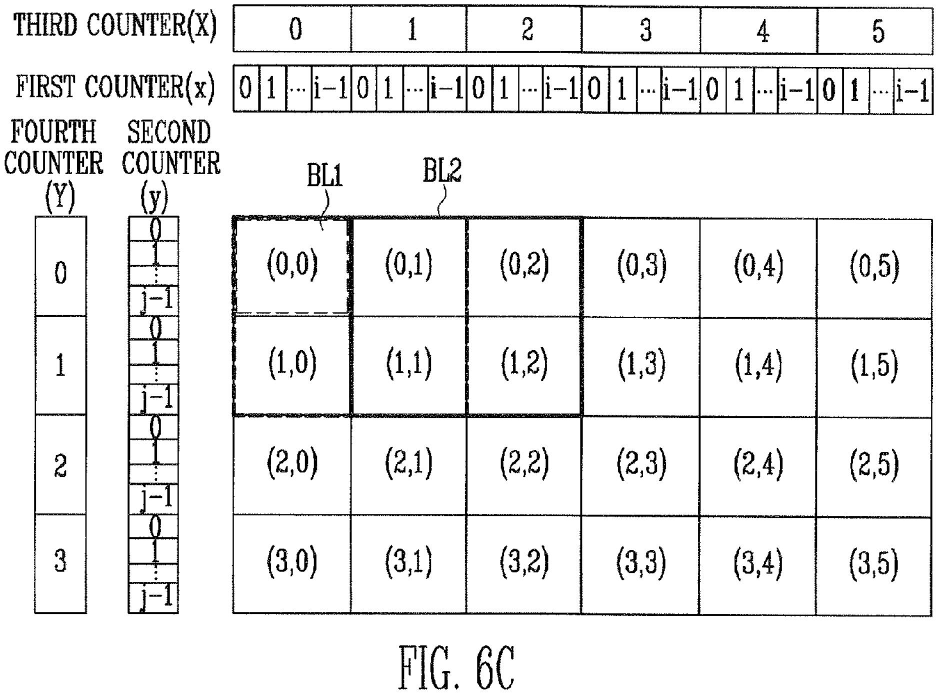
Figure 6C:
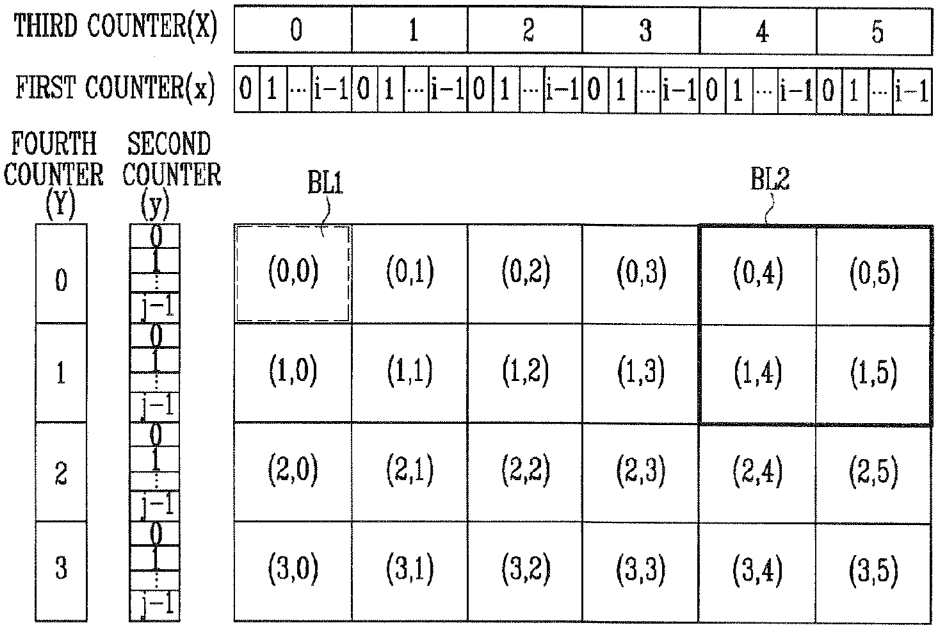
Figure 6D:
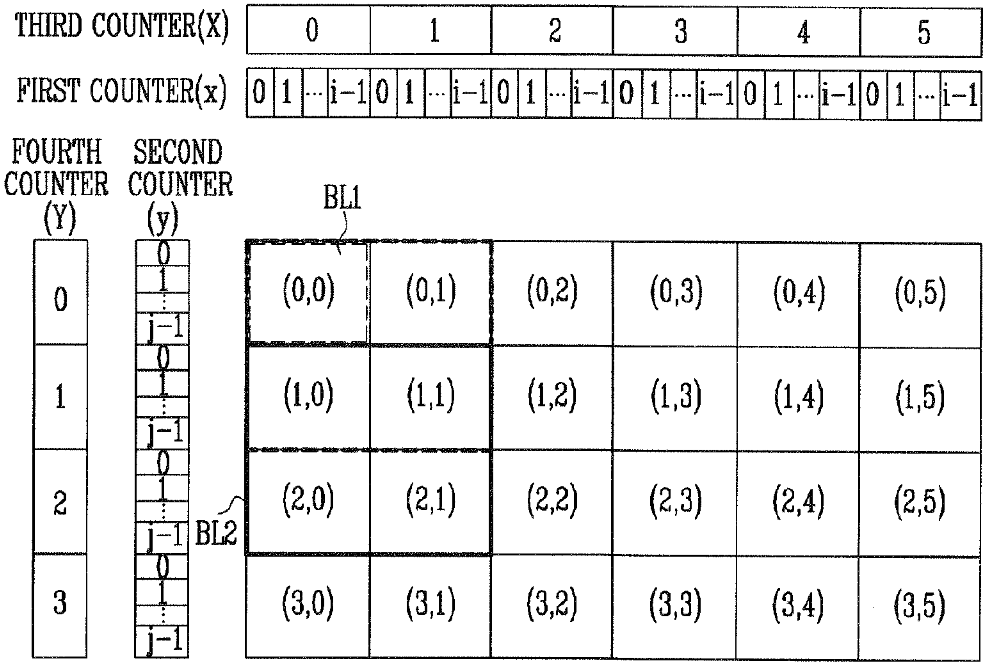

According to the present invention, when the second blocks BL2 are divided, each second block BL2 may be set to share one or more first blocks BL1 with another second block adjacent thereto. For example, the second blocks BL2 are sequentially divided by being shifted by one first block BL1 in the horizontal direction as shown in FIG. 6B. If the division of second blocks BL2 on a corresponding horizontal line may be completed as shown in FIG. 6C, the second blocks BL2 are shifted by one first block BL1 in the vertical direction as shown in FIG. 6D, so that the division of second blocks BL2 on the next horizontal line may be started.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:

a pixel unit having a plurality of pixels positioned at intersection portions of scan lines and data lines; and a degradation detector dividing the pixel unit into a plurality of first blocks each including a plurality of pixels, and detecting degradation information for a second block that includes a plurality of first blocks, said degradation detector divides the second blocks so that each second block shares one or more first blocks with another second block adjacent thereto.

2. The organic light emitting display of claim 1, wherein the degradation detector generates accumulation data for each first block of the plurality of first blocks during a certain period, and detects the degradation information by adding the accumulation data for each second block.

3. The organic light emitting display of claim 1, wherein the degradation detector divides the pixel unit into the second blocks to each include two or more first blocks in a horizontal direction and two or more first blocks in a vertical direction.

4. The organic light emitting display of claim 1, wherein the degradation detector divides the pixel unit into the second blocks by shifting the second blocks in the horizontal and vertical directions, corresponding to shift interval information included in a shift control signal supplied from the outside thereof.

5. The organic light emitting display of claim 1, wherein the degradation detector divides the pixel unit into the second blocks by shifting the second blocks in the horizontal and vertical directions, corresponding to predetermined shift interval information.

6. The organic light emitting display of claim 1, wherein the degradation detector includes:

a data accumulation unit generating accumulation data for each first block during a certain period;

a degradation data generation unit generating degradation data by adding the accumulation data for each second block; and a degradation decision unit generating a degradation detection signal corresponding to the degradation data.

7. The organic light emitting display of claim 6, wherein the data accumulation unit includes:

a first counter receiving a first horizontal block control signal that means the number of data in the horizontal direction so as to generate a first counting signal by counting the number of data in the horizontal direction;

a second counter receiving a first vertical block control signal that means the number of data in the vertical direction so as to generate a second counting signal by counting the number of data in the vertical direction;

a third counter generating a third counting signal sequentially increased corresponding to the first counting signal;

a fourth counter generating a fourth counting signal sequentially increased corresponding to the second counting signal; and an accumulation data generator generating accumulation data for each first block divided by the third and fourth counting signals during a certain period.

8. The organic light emitting display of claim 6, wherein the degradation data generation unit includes:

a detection position setting unit allowing the second blocks to be divided, using a second horizontal block control signal including information on the positions of first blocks on a horizontal line, a second vertical block control signal including information on the positions of first blocks on a vertical line, and information on the interval by which the second blocks are shifted; and a data adding unit generating a data addition value of each second block by adding accumulation data of the first blocks included in each second block, and generating degradation data for each second block, based on the data addition value.

9. The organic light emitting display of claim 8, wherein the degradation data includes information on the position and degradation of the second block.

10. The organic light emitting display of claim 6, wherein the degradation decision unit generates the degradation detection signal when the degradation data is a predetermined reference value or more.

11. The organic light emitting display of claim 10, wherein the degradation detection signal includes information on the position and degradation of a corresponding second block.

12. A driving method of an organic light emitting display, comprising:

dividing a pixel unit into a plurality of first blocks each including a plurality of pixels;

generating accumulation data by accumulating data for each first block during a certain period;

dividing the pixel unit into second blocks each including a plurality of first blocks; and detecting degradation information for each second block by adding accumulation data of the first blocks included in each second block, wherein the second blocks are divided by being sequentially shifted in horizontal and vertical directions, and wherein the second blocks are divided so that each second block shares one or more first blocks with another second block adjacent thereto.

13. The driving method of claim 12, wherein the second blocks are divided so that each second block includes two or more first blocks in the horizontal direction and two or more first blocks in the vertical direction.

14. The driving method of claim 12, wherein the second blocks are divided by being shifted in the horizontal and vertical directions, corresponding to shift interval information included in a shift control signal supplied from the outside of the organic light emitting display.

15. The driving method of claim 12, wherein the second blocks are divided by being shifted in the horizontal and vertical directions, corresponding to predetermined shift interval information.

16. The driving method of claim 12, wherein the dividing of the pixel unit into the plurality of first blocks each including the plurality of pixels includes:

receiving a first horizontal block control signal that means the number of data in the horizontal direction so as to generate a first counting signal by counting the number of data in the horizontal direction;

receiving a first vertical block control signal that means the number of data in the vertical direction so as to generate a second counting signal by counting the number of data in the vertical direction;

generating a third counting signal sequentially increased corresponding to the first counting signal;

generating a fourth counting signal sequentially increased corresponding to the second counting signal; and allowing the first blocks to be divided by the third and fourth counting signals.

17. The driving method of claim 12, wherein the dividing of the pixel unit into the second blocks each including the plurality of first blocks includes allowing the second blocks to be divided, using a second horizontal block control signal including information on the positions of first blocks on a horizontal line, a second vertical block control signal including information on the positions of first blocks on a vertical line, and information on the interval by which the second blocks are shifted.

18. The driving method of claim 12, further comprising deciding the presence of degradation by comparing the degradation information for each second block with a predetermined reference value.

19. The driving method of claim 18, further comprising generating a degradation detection signal including information on the position and degradation of a corresponding second block when the degradation information is the predetermined reference value or more.

20. An organic light emitting display, comprising:

a pixel unit having a plurality of pixels positioned at intersection portions of scan lines and data lines; and a degradation detector dividing the pixel unit into a plurality of first blocks each including a plurality of pixels, and detecting degradation information for a second block that includes a plurality of first blocks, said degradation detector divides the second blocks so that each second block shares one or more first blocks with another second block adjacent thereto, wherein the second blocks are divided by being sequentially shifted in horizontal and vertical directions, and wherein the second blocks are divided so that each second block shares one or more first blocks with another second block immediately adjacent thereto.

* * * * *